US006937071B1

(12) United States Patent
Moraveji (10) Patent No.: US 6,937,071 B1
(45) Date of Patent: Aug. 30, 2005

(54) HIGH FREQUENCY DIFFERENTIAL POWER AMPLIFIER

(75) Inventor: Farhood Moraveji, Saratoga, CA (US)

(73) Assignee: Micrel, Incorporated, San Jose, CA (US)

( * ) Notice: Subject to any disclaimer, the term of this patent is extended or adjusted under 35 U.S.C. 154(b) by 0 days.

(21) Appl. No.: 10/802,894

(22) Filed: Mar. 16, 2004

(51) Int. Cl.[7] .......................................... G01R 19/00
(52) U.S. Cl. ........................................ 327/54; 327/89
(58) Field of Search .............................. 327/51–52, 54, 327/56, 60, 63–65, 67–69, 72, 77–83, 85, 327/87–90, 266, 274, 287, 545–547, 560–563; 330/252–253, 259–261, 270–273

(56) References Cited

U.S. PATENT DOCUMENTS

| | | | |
|---|---|---|---|
| 3,947,779 A | 3/1976 | Reinhard | 330/10 |
| 3,982,233 A | 9/1976 | Crookshanks | 365/130 |
| 3,982,826 A | 9/1976 | Saito | 352/14 |
| 4,015,117 A | 3/1977 | Wicklund, Jr. | 250/559.29 |
| 4,024,462 A | 5/1977 | Highnote et al. | 330/259 |
| 4,065,724 A | 12/1977 | Wicklund, Jr. | 330/252 |
| 4,206,316 A | 6/1980 | Burnsweig et al. | 178/66.1 |
| 4,274,039 A | 6/1981 | Glassey et al. | 318/678 |
| 4,331,157 A | 5/1982 | Keller, Jr. et al. | 600/509 |
| 4,482,866 A | 11/1984 | Crooks | 330/149 |
| 4,517,523 A | 5/1985 | Miles | 330/126 |
| 4,528,515 A | 7/1985 | Gross | 330/254 |
| 4,638,258 A | 1/1987 | Crooks | 330/149 |
| 4,698,842 A | 10/1987 | Mackie et al. | 381/1 |
| 4,769,616 A | 9/1988 | Barbu | 330/252 |
| 4,825,173 A | 4/1989 | Cornett | 330/252 |
| 4,847,831 A | 7/1989 | Spiesman et al. | 370/501 |
| 4,942,399 A | 7/1990 | Buchholtz et al. | 341/143 |
| 5,025,456 A | 6/1991 | Ota et al. | 375/318 |
| 5,148,119 A | 9/1992 | Wright et al. | 330/259 |
| 5,220,164 A | 6/1993 | Lieber et al. | 250/214 VT |
| 5,283,514 A | 2/1994 | Hayward et al. | 323/280 |
| 5,349,644 A | 9/1994 | Massey et al. | 706/10 |
| 5,357,209 A | 10/1994 | Mader et al. | 330/252 |
| 5,426,542 A | 6/1995 | Smith | 360/67 |
| 5,485,433 A | 1/1996 | Satomura et al. | 369/13.02 |
| 5,550,513 A | 8/1996 | Wong | 330/286 |
| 5,568,099 A | 10/1996 | Du | 331/57 |
| 5,608,328 A | 3/1997 | Sanderson | 324/529 |
| 5,638,030 A | 6/1997 | Du | 331/573 |
| 5,648,743 A | 7/1997 | Nagaya et al. | 330/252 |
| 5,708,391 A | 1/1998 | Altmann et al. | 330/252 |
| 5,734,298 A | 3/1998 | Nagaya et al. | 330/253 |
| 5,764,110 A | 6/1998 | Ishibashi | 331/57 |

(Continued)

Primary Examiner—My-Trang Nu Ton
(74) Attorney, Agent, or Firm—Bever, Hoffman & Harms, LLP (57) ABSTRACT

A differential CMOS amplifier includes two CMOS inverters and biasing circuitry providing feedback loops across the output and input of each inverter. The biasing circuitry provides linear biasing so that the inverters can apply a desired gain to a pair of high frequency input signals (i.e., a differential input signal). The biasing circuitry can include operational amplifiers (op-amps) for providing positive feedback control between the output and input of the inverters. The inputs of the inverters can be regulated by this feedback loop such that their outputs are driven to the reference voltage, thereby forcing the inverters to operate in their linear regions so that non-distorting amplification can be applied to the input AC signals.

25 Claims, 4 Drawing Sheets

U.S. PATENT DOCUMENTS

| | | | |
|---|---|---|---|
| 5,945,883 A | 8/1999 | Nagasawa et al. | 331/57 |
| 6,061,702 A | 5/2000 | Hoffman | 708/251 |
| 6,160,578 A | 12/2000 | Carroll et al. | 348/222.1 |
| 6,163,219 A * | 12/2000 | Kanasugi | 330/282 |
| 6,169,462 B1 * | 1/2001 | White | 331/158 |
| 6,175,885 B1 | 1/2001 | Marbot et al. | 710/71 |
| 6,177,832 B1 | 1/2001 | Durec et al. | 327/563 |
| 6,292,116 B1 | 9/2001 | Wang et al. | 341/100 |
| 6,392,486 B1 | 5/2002 | Lemay, Jr. | 330/253 |
| 6,411,151 B1 | 6/2002 | Nair et al. | 327/291 |
| 6,545,502 B1 | 4/2003 | Dasgupta et al. | 326/21 |
| 6,563,377 B2 | 5/2003 | Butler | 330/10 |
| 6,618,305 B2 | 9/2003 | Ernst et al. | 365/201 |
| 6,624,697 B2 | 9/2003 | Taylor | 330/258 |
| 6,643,324 B1 | 11/2003 | Gasparik | 375/229 |
| 6,654,900 B1 * | 11/2003 | Cave | 713/501 |
| 6,664,609 B2 | 12/2003 | Ito et al. | 257/560 |
| 6,693,457 B2 | 2/2004 | Yepp | 326/62 |
| 6,737,924 B1 * | 5/2004 | Paillet et al. | 330/308 |
| 6,798,251 B1 * | 9/2004 | Schafferer | 327/52 |

* cited by examiner

HIGH FREQUENCY DIFFERENTIAL POWER AMPLIFIER

BACKGROUND

1. Field of the Invention

The invention relates to the field of high frequency communications, an in particular to a complementary metal-oxide-semiconductor high frequency amplifier.

2. Related Art

A differential amplifier is a fundamental electronic circuit that generates an output signal based on the difference between two input signals (a differential input signal). The output signal is therefore representative of the magnitude of the difference between the two input signals. To reduce costs (which is particularly important for consumer goods such as cellular telephones), differential amplifiers are often implemented using a metal-oxide-semiconductor (MOS) or complementary MOS (CMOS) process instead of the more expensive bipolar process.

Figure 1:
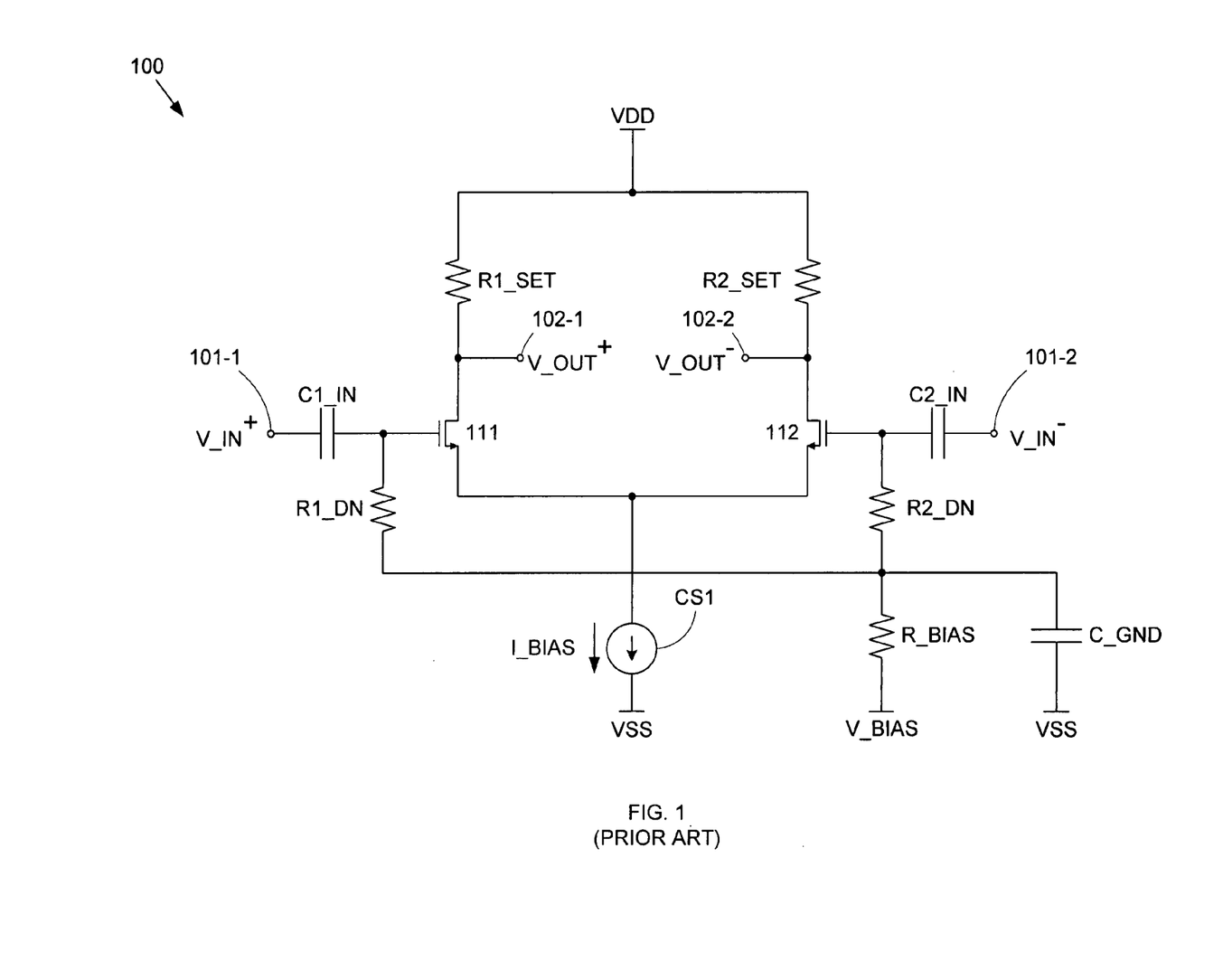
FIG. 1 is a schematic diagram of a conventional CMOS RF differential amplifier.

FIG. 1 shows a conventional RF MOS differential amplifier 100. MOS differential amplifier 100 includes input terminals 101-1 and 101-2, capacitors C1_IN, C2_IN, and C_GND, NMOS resistors R1_SET, R2_SET, R1_DN, R2_DN, and R_BIAS, transistors 111 and 112, output terminals 102-1 and 102-2, and a current source CS1.

Capacitor C1_IN is coupled between input terminal 101-1 and the gate of transistor 111, while capacitor C2_IN is coupled between input terminal 101-2 and the gate of transistor 112. Capacitors C1_IN and C2_IN therefore provide DC filtering of input RF signals $V\_IN^+$ and $V\_IN^-$, respectively, which are applied to input terminals 101-1 and 101-2, respectively.

Meanwhile, resistors R1_SET and R2_SET (which typically are the same resistance) couple the drains of transistors 111 and 112, respectively, to an upper supply voltage VDD, while current source CS1 couples the sources of transistors 111 and 112 to a lower supply voltage VSS. Finally, output terminals 102-1 and 102-2 are connected to the drains of transistors 111 and 112, respectively.

Thus, transistors 111 and 112 are configured as a differential pair. Resistors R1_DN and R2_DN, in conjunction with resistor R_BIAS, provide a desired bias voltage V_BIAS to the gates of transistors 111 and 112, respectively. At the same time, capacitor C_GND provides an AC short between resistors R1_DN and R2_DN and lower supply voltage VSS, thereby setting the input impedances seen at the sources of transistors 111 and 112 equal to the values of resistors R1_DN and R2_DN, respectively.

The differential input signal V_DIFF(IN) (equal to $V\_IN^+$ minus $V\_IN^-$) provided to differential amplifier 100 during balanced operations is equal to zero, and a bias current I_BIAS provided by current source CS1 is equally divided between transistors 111 and 112 (if resistors R1_SET and R2_SET have equal resistances). However, as is known in the art, when differential input signal V_DIFF(IN) is not equal to zero, a differential current I_DIFF flows across transistors 111 and 112. The value of differential current I_DIFF is given by the following:

$$I\_DIFF = V\_DIFF(IN)/(1/g_{m111} + 1/g_{m112}) \quad (1)$$

where $g_{m111}$ and $g_{m112}$ are the transconductances of transistors 111 and 112, respectively.

The magnitude of output signals $V\_OUT^+$ and $V\_OUT^-$ are then determined by the magnitude of differential current I_DIFF and resistors R1_SET and R2_SET, respectively. For example, output signal $V\_OUT^+$ is given by the following:

$$V\_OUT^+ = VDD - R1\_SET(\tfrac{1}{2}I\_BIAS + I\_DIFF) \quad (2)$$

Similarly, output signal $V\_OUT^-$ is given by the following:

$$V\_OUT^- = VDD - R2\_SET(\tfrac{1}{2}I\_BIAS - I\_DIFF) \quad (3)$$

If resistors R1_SET and R2_SET are both equal to the same resistance R_SET, equations 2 and 3 can be combined to determine the magnitude of an output differential signal V_DIFF(OUT) (equal to $V\_OUT^+$ minus $V\_OUT^-$) as follows:

$$V\_DIFF(OUT) = -2R\_SET \cdot I\_DIFF \quad (4)$$

Finally, if the transconductances of transistors 111 and 112 are the same (i.e., $g_{m111} = g_{ml2} = g_m$), equation 1 can be substituted into equation 4, so that the magnitude of output differential signal V_DIFF(OUT) resolves to:

$$V\_DIFF(OUT) = 2R\_SET * \frac{V\_DIFF(IN)}{2/g_m} \quad (5)$$

Thus, as indicated by equation 5, the gain provided by differential amplifier 100 can be increased by either increasing resistance R_SET (i.e., the resistances of resistors R1_SET and R2_SET), or by increasing transconductance gm (i.e., by increasing transconductances $g_{m111}$ and $g_{m112}$).

Unfortunately, because of the common-source implementations used in differential amplifier 100, increasing resistance R_SET and/or increasing transconductance gm can result in undesirable output signal degradation. For example, increasing the resistance of resistors R1_SET and R2_SET can lead to excessive voltage drops between supply voltage VDD and output terminals 102-1 and 102-2, respectively, that distort the output signal swing. Similarly, increasing transconductances $g_{m111}$ and $g_{m112}$ (and possibly increasing bias current I_BIAS) will result in larger current magnitudes through resistors R1_SET and R2_SET, respectively, which once again can lead to excessive voltage drops.

Another problematic issue relates to the fact that increasing the size of resistors R1_SET and R2_SET and/or increasing current I_BIAS can significantly increase the power consumption of differential amplifier 100. This power inefficiency is generally undesirable, and can be particularly problematic in devices that run off of a self-contained power supply (a battery). For example, using amplifier 100 in a cellular telephone to reduce the overall cost of the phone may result in an unacceptable decrease in talk time for that phone.

Accordingly, it is desirable to provide a power-efficient, high frequency CMOS differential amplifier.

SUMMARY OF THE INVENTION

According to an embodiment of the invention, a high-frequency differential amplifier includes two CMOS inverters and biasing circuitry. The CMOS inverters apply a desired gain to a differential input signal based on the transconductance and output impedance values of the transistors making up the inverters. Meanwhile, the biasing circuitry applies linear biasing to the CMOS inverters without consuming excessive power.

The biasing circuitry provides a DC feedback loop that forces a DC bias voltage to appear at the outputs of the inverters. By selecting the DC bias voltage to be between the logic HIGH and LOW output levels of the inverters, the inverters can be forced to operate in their linear region. AC signals at the inputs of the inverters will then be amplified by the inverters without distortion (clipping), so long as the amplitudes of the AC signals are not large enough to drive either inverter out of its linear mode of operation.

According to an embodiment of the invention, the biasing circuitry includes a reference voltage source and a separate bias circuit for each inverter, with each bias circuit including an operational amplifier (op-amp). The op-amp in each bias circuit is connected in a feedback loop between the output and input of one of the inverters, while the reference voltage source provides a reference voltage to the non-inverting input of the op-amp. The op-amp therefore adjusts the input voltage of its associated inverter to regulate the output of that inverter to be equal to the reference voltage.

This DC control provided by each op-amp ensures that the inverters will operate in their linear regions as long as the input signals are not large enough to push the transistors of the inverters into saturation. By setting the reference voltage equal to half of the voltage difference between the upper and lower supply voltages provided to the amplifier, the output range of the amplifier can be maximized.

These and other aspects of the invention will be more fully understood in view of the following description of the exemplary embodiments and the drawings thereof.

DETAILED DESCRIPTION

Figure 2A:
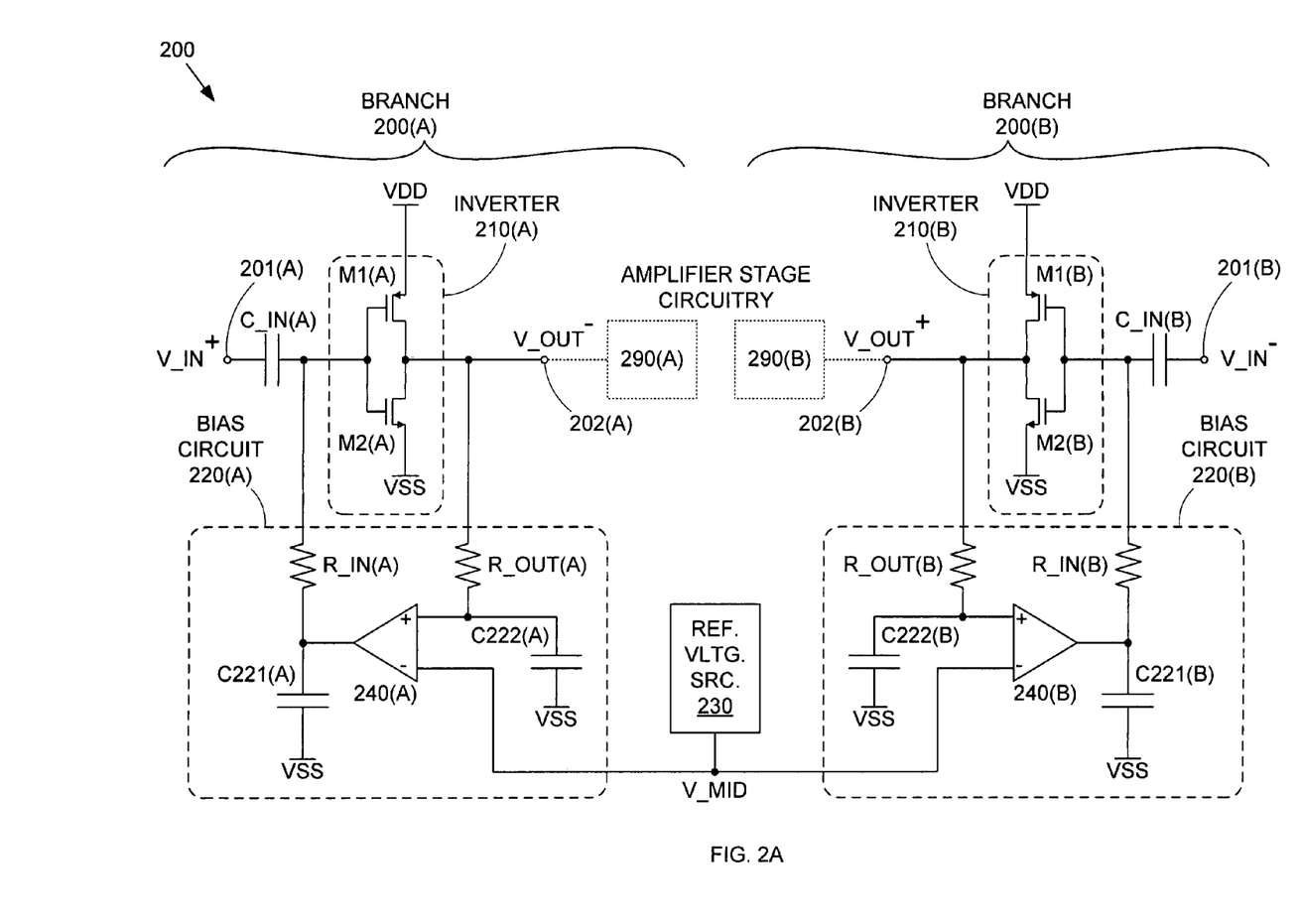
FIG. 2A is a schematic diagram of a CMOS high-frequency differential amplifier circuit in accordance with an embodiment of the invention.

FIG. 2A shows a high-frequency amplifier circuit 200 in accordance with an embodiment of the invention. Amplifier circuit 200 is formed from two branches 200(A) and 200(B). Branch 200(A) includes an input terminal 201(A), an output terminal 202(A), a CMOS inverter 210(A), a capacitor C_IN(A), and a bias circuit 220(A). Capacitor C_IN(A) is coupled between input terminal 201(A) and the input of inverter 210(A) and provides DC filtering at the input of inverter 210(A). Bias circuit 220(A) is connected between the output and input of inverter 210(A).

Inverter 210(A) includes a PMOS transistor M1(A) and an NMOS transistor M2(A) that are serially coupled between an upper supply voltage VDD and a lower supply voltage (e.g., ground). The gate terminals of transistors M1(A) and M2(A) are connected to form the input of inverter 210(A), while the drain terminals of transistors M1(A) and M2(A) are connected to form the output of inverter 210(A).

Branch 200(B) is substantially similar to branch 200(A), and includes an input terminal 201(B), an output terminal 202(B), a CMOS inverter 210(B), a capacitor C_IN(B), and a bias circuit 220(B). Capacitor C_IN(B) is coupled between input terminal 201(B) and the input of inverter 210(B) and provides DC filtering at the input of inverter 210(B). Bias circuit 220(B) is connected between the output and input of inverter 210 (B).

Inverter 210(B) includes a PMOS transistor M1(B) and an NMOS transistor M2(B) that are serially coupled between upper supply voltage VDD and lower supply voltage VSS. The gate terminals of transistors M1(B) and M2(B) are connected to form the input of inverter 210(B), while the drain terminals of transistors M1(B) and M2(B) are connected to form the output of inverter 210(B).

Amplifier circuit 200 is coupled to receive a high-frequency input signal V_IN$^+$ at input terminal 201(A) and a high-frequency input signal V_IN$^-$ at input terminal 201(B). High-frequency signals V_IN$^+$ and V_IN$^-$ can, for example, comprise RF signals.

Meanwhile, bias circuits 220(A) and 220(B) provide linear biasing feedback loops between the outputs and inputs of inverters 210(A) and 210(B), respectively. In other words, bias circuit 220(A) provides a DC bias voltage to the input of inverter 210(A) that forces the nominal output of inverter 210(A) to a level between upper supply voltage VDD and lower supply voltage VSS, which in turn causes inverter 210(A) to operate in its linear region. Similarly, bias circuit 220(B) provides a DC bias voltage to the input of inverter 210(B) that forces the nominal output of inverter 210(B) to a level between upper supply voltage VDD and lower supply voltage VSS, which in turn causes inverter 210(B) to operate in its linear region. Ideally, the outputs of both inverters 210(A) and 210(B) are forced to midway between upper supply voltage VDD and lower supply voltage VSS to allow for maximum output swing.

Note that this DC biasing of the outputs of inverters 210(A) and 210(B) is common mode for both inverters, and therefore cancels itself out when the outputs of the inverters are taken as a differential output. Therefore, blocking capacitors are not required between the outputs of inverters 210(A) and 210(B) and output terminals 202(A) and 202(B), respectively.

Figure 2B:
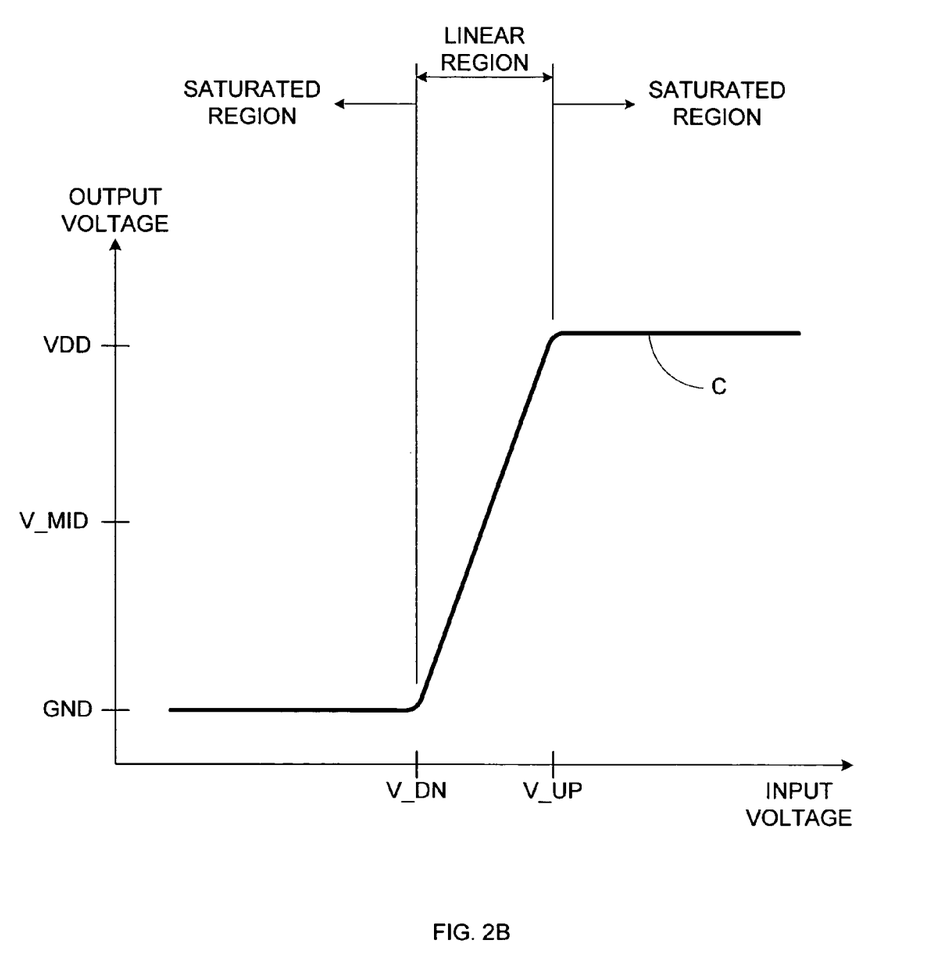
FIG. 2B is a sample graph of the response curve of an inverter, depicting the linear and saturated regions of operation of the inverter.

FIG. 2B shows an exemplary response curve C for inverters 210(A) and 210(B). Response curve C consists of two main regions—a saturated region that corresponds to all input voltages less than a lower limit voltage V_DN or greater than an upper limit voltage V_UP, and a linear region that corresponds to all input voltages between voltages V_DN and V_UP. Because the normal use of an inverter is to invert a logic LOW or HIGH input signal into a logic HIGH or LOW output signal, respectively, an inverter is generally operated in its saturated region, and will only incidentally pass through its linear region as its output switches between logic LOW (GND) and logic HIGH (VDD).

However, the linear biasing provided by bias circuits 220(A) and 220(B) forces inverters 210(A) and 210(B), respectively, to operate in their linear regions, so that inverters 210(A) and 210(B) can be used to provide signal amplification. Specifically, the DC bias voltages supplied by bias circuits 220(A) and 220(B) force the nominal inverter output voltages (i.e., the voltages at the outputs of the inverters when no AC signal is present) for inverters 210(A) and 210(B) to levels between upper supply voltage VDD and lower supply voltage VSS.

The outputs of inverters 210(A) and 210(B) will therefore swing around this nominal inverter output voltage, thereby ensuring that inverters 210(A) and 210(B) provide AC output signals that are proportional to their AC input signals (so long as the AC input signal amplitude does not push inverters 210(A) and 210(B) into saturation). By setting the nominal inverter output voltage equal to half of the difference between upper supply voltage VDD and lower supply voltage VSS (e.g., if supply voltage VSS is ground, then the nominal inverter output voltage would be VDD/2), the total output swing of differential amplifier 200 can be maximized (i.e., output swing equal to 2*VDD). Note that because inverters 210(A) and 210(B) do not include any resistive elements, this increased gain does not result in output signal distortion (unlike the results described with respect to conventional differential amplifier 100 shown in FIG. 1).

Returning to FIG. 2A, according to an embodiment of the invention, bias circuit 220(A) includes resistors R_IN(A) and R_OUT(A), optional capacitors C221(A) and C222(A), and an operational amplifier (op-amp) 240(A). Resistor R_IN(A) is connected between the input of inverter 210(A) and the output of op-amp 240(A), while resistor R_OUT(A) is connected between the output of inverter 210(A) and the non-inverting input of op-amp 240(A). Capacitor C221(A) is connected between the output of op-amp 240(A) and ground, while capacitor C222(A) is connected between the non-inverting input of op-amp 240(A) and ground.

Similarly, bias circuit 220(B) includes resistors R_IN(B) and R_OUT(B), optional capacitors C221(B) and C222(B), and an operational amplifier (op-amp) 240(B). Resistor R_IN(B) is connected between the input of inverter 210(B) and the output of op-amp 240(B), while resistor R_OUT(B) is connected between the output of inverter 210(B) and the non-inverting input of op-amp 240(B). Capacitor C221(B) is connected between the output of op-amp 240(B) and ground, while capacitor C222(B) is connected between the non-inverting input of op-amp 240(B) and ground.

Reference voltage source 230 provides a reference voltage V_MID to the inverting inputs of op-amps 240(A) and 240(B). Meanwhile, the non-inverting inputs of op-amps 240(A) and 240(B) receive the outputs of inverters 210(A) and 210(B), respectively (via resistors R_OUT(A) and R_OUT(B), respectively). If the voltage at the output of inverter 210(A) is less than reference voltage V_MID, op-amp 240(A) decreases its output voltage (and hence the voltage provided at the input of inverter 210(A) via resistor R_IN(A)), thereby raising the output of inverter 210(A). Likewise, if the voltage at the output of inverter 210(A) is greater than reference voltage V_MID, op-amp 240(A) increases its output voltage to decrease the output of inverter 210(A). Op-amp 240(B) regulates the output of inverter 210(B) in a similar manner.

In this manner, op-amps 240(A) and 240(B) create DC bias voltages at the inputs of inverters 210(A) and 210(B), respectively, such that each inverter has a DC offset voltage at its output that is equal to reference voltage V_MID. This DC biasing of the inverter inputs forces inverters 210(A) and 210(B) to operate in the linear mode, so that gain can be applied to signals provided to inverters 210(A) and 210(B) without distortion (clipping). Note that, while reference voltage V_MID can be set to any value between supply voltage VDD and ground (the upper and lower supply voltages), the maximum output range of amplifier circuit 200 will be provided by setting reference voltage V_MID halfway between supply voltage VDD and ground (i.e., V_MID=VDD/2).

Note further, that it is desirable that the linear biasing provided by bias circuits 220(A) and 220(B) not be affected by (or affect) the AC signal being amplified by amplifier circuit 200. Accordingly, resistors R_IN(A) and R_OUT (A) isolate op-amp 240(A) from any AC signals that are provided to or generated by inverter 210(A) by suppressing the bulk of those signals before they reach op-amp 240(A). Meanwhile, optional capacitors C221(A) and C222(A) can provide a direct path to ground for any AC that does get by resistors R_IN(A) and R_OUT(A), respectively, or is generated by op-amp 240(A). In a similar manner, resistors R_IN(B) and R_OUT(B) and capacitors C221(A) and C222(B) provide AC isolation for op-amp 240(B).

Practitioners will readily appreciate that because bias circuits 220(A) and 220(B) do not include constant bias currents (e.g., currents I_BIAS-1 and I_BIAS-2 shown in FIG. 1) flowing through large resistive elements (e.g., resistors RD(A) and/or RD(B) shown in FIG. 1), the power consumption of amplifier circuit 200 shown in FIG. 2A can be significantly less than the power consumption of conventional amplifier 100.

Furthermore, because of the linear biasing provided by bias circuits 220(A) and 220(B), inverters 210(A) and 210 (B) can both provide a significant amount of gain (while operating in their linear regions). For example, the actual gain G provided by inverter 210(A) is given by the following equation:

$$G=(g_{m1}+g_{m2})*(Ro_1\|Ro_2) \qquad (6)$$

where $g_{m1}$ and $g_{m2}$ are the transconductances of transistors M1(A) and M2(A), respectively, and $Ro_1$ and $Ro_2$ are the output resistances of transistors M1(A) and M2(A), respectively.

The term "$Ro_1\|Ro_2$" represents the parallel resistance of Ro1 and Ro2, and resolves to the equation:

$$Ro_1\|Ro_2=(Ro_1*Ro_2)/(Ro_1+Ro_2) \qquad (7)$$

Substituting equation (7) into equation (6) therefore yields a gain equation of:

$$G=(g_{m1}+g_{m2})/(Y_1+Y_2) \qquad (8)$$

where $Y_1$ is equal to $1/Ro_1$ and $Y_2$ is equal to $1/Ro_2$.

Note that if transconductances $g_{m1}$ and $g_{m2}$ are equal, and if output resistances Ro1 and Ro2 are equal, equation 8 resolves to the following:

$$G=g_m*Ro \qquad (9)$$

where $g_m=g_{m1}=g_{m2}$, and Ro=Ro1=Ro2. Gain G is therefore proportional to transconductance $g_m$ and output resistance Ro.

MOS transconductance $g_m$ is given by the following:

$$g_m = 2\sqrt{k_p \frac{w}{l} I_D} \qquad (10)$$

where $k_p$ is the intrinsic transconductance parameter for the MOS transistor, w/l is the aspect ratio of the transistor, and ID is the drain current. Meanwhile, output resistance Ro is given by the following:

$$Ro = \frac{1}{\lambda I_D} \quad (11)$$

where λ is the channel length modulation parameter for the transistor. Therefore, by substituting equations 10 and 11 into equation 9, gain G can be expressed by the following:

$$G = 2\sqrt{k_P/I_D} * \frac{1}{\lambda} \quad (12)$$

Thus, as indicated by equation 12, the gain provided by an inverter-based differential amplifier such as shown in FIG. 2A is inversely proportional to drain current, and is therefore not subject to the output distortion associated with common-source based amplifier 100 shown in FIG. 1.

As indicated by equation 10, in a MOS transistor, the transconductance is proportional to the aspect ratio (width/length) of the gate. Therefore, by adjusting the gate dimensions of transistors M1(A) and M2(A), the gain provided by branch 200(A) of amplifier circuit 200 can be adjusted. For similar reasons, by adjusting the gate dimensions of transistors M1(B) and M2(B), the gain provided by branch 200(B) can be adjusted.

For example, according to an embodiment of the invention, supply voltage VDD can be 1.8V, reference voltage V_MID can be set to 0.9V, transistors M1(A) and M1(B) can have aspect ratios of 27/0.35, transistors M2(A) and M2(B) can have aspect ratios of 21.6/0.35, resistors R_IN(A), R_OUT(A), R_IN(B), and R_OUT(B) can have resistances of 1.5 kΩ each, and capacitors C_IN(A), C_OUT(A), C_IN(B), and C_OUT(B) can have capacitances of 150 fF each. Branches 200(A) and 200(B) would then provide between 10–15 dB of RF gain each.

Note that while branches 200(A) and 200(B) shown in FIG. 2A are described as single stages for exemplary purposes, each of branches 200(A) and 200(B) can comprise a stage in a series of cascaded amplifier stages, or a predriver for additional amplifier circuitry, as indicated by optional (dotted line) amplifier stage circuitry 290(A) and 290(B).

Figure 3:
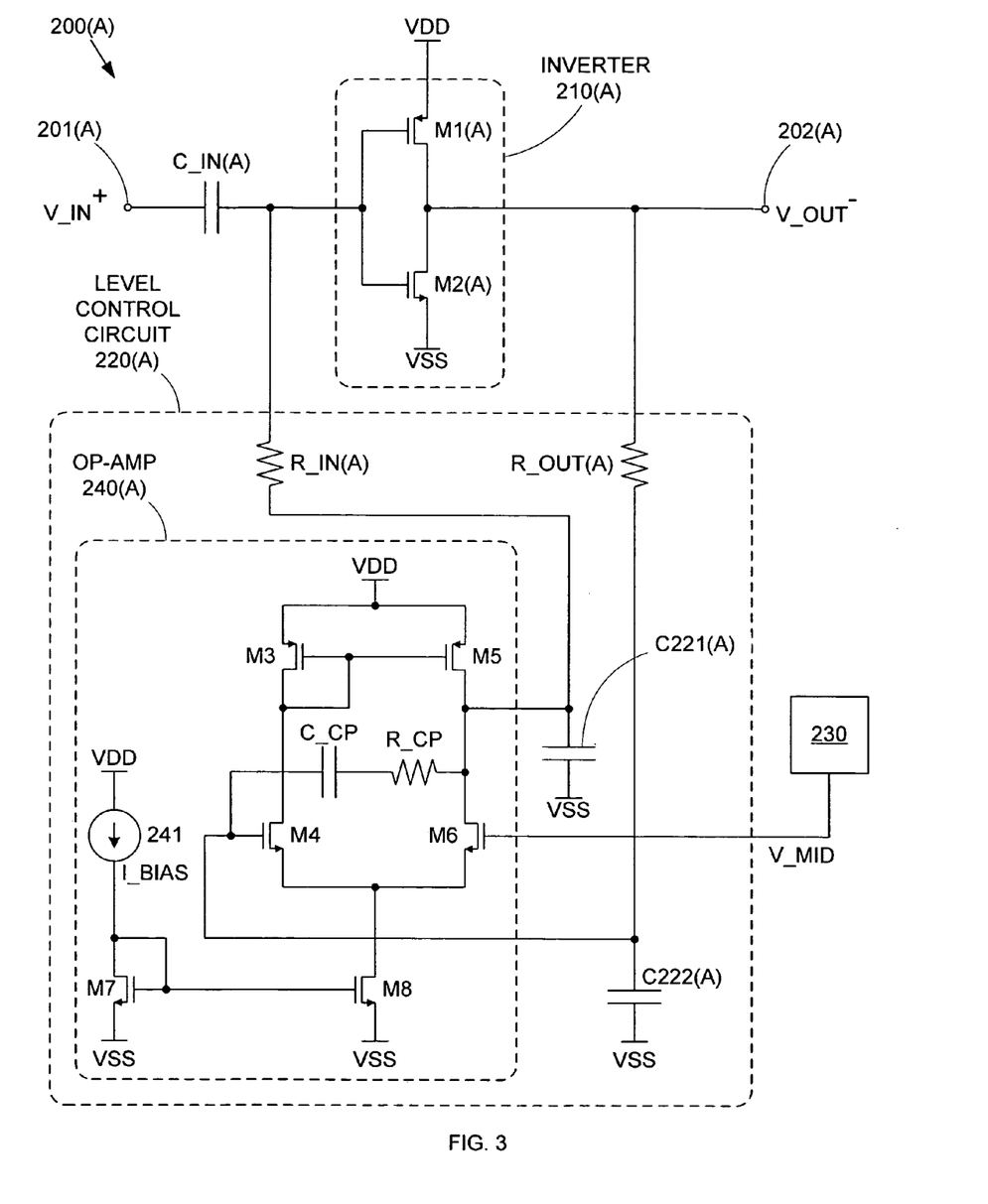
FIG. 3 is a schematic diagram of a branch of the CMOS high-frequency differential amplifier circuit of FIG. 2A that includes a detail view of a schematic for an operational amplifier in accordance with an embodiment of the invention.

FIG. 3 shows a detailed view of branch 200(A) that depicts a schematic diagram for op-amp 240(A), according to an embodiment of the invention. (A similar op-amp circuit could be used for op-amp 240(B) in FIG. 2A.) Op-amp 240(A) includes PMOS transistors M3 and M5, NMOS transistors M4, M6, M7, and M8, a current source 241, a capacitor C_CP, and a resistor R_CP.

Transistors M3 and M4 are connected in series between supply voltage VDD and transistor M8, and transistors M5 and M6 are connected in series between supply voltage VDD and transistor M8. Transistor M8 is coupled between transistor M4 and ground, and current source 241 and transistor M7 are connected in series between supply voltage VDD and ground. Finally, capacitor C_CP and resistor R_CP are connected in series between the gate of transistor M4 and the drain of transistor M6.

The gate of transistor M4 forms the non-inverting input of op-amp 240(A), and is accordingly coupled to the input of inverter 210(A) via resistor R_OUT(A). Meanwhile, the gate of transistor M6 forms the inverting input of op-amp 240(A), and is therefore coupled to reference voltage circuit 230(A). And the junction between transistors M5 and M6 forms the output of op-amp 240(A), and is therefore coupled to the input of inverter 210(A) via resistor R_IN(A).

Thus, capacitor C_CP and resistor R_CP are coupled between the non-inverting input and the output of op-amp 240(A). Capacitor C_CP and resistor R_CP form a compensation circuit that improves the stability of op-amp 240(A) by preventing unwanted oscillations. Note that various other op-amp compensation circuits will be readily apparent.

The gate and drain of transistor M7 are shorted, and the gates of transistors M7 and M8 are connected to form a current mirror. Therefore, a current I_BIAS from current source 241 that is sunk by transistor M7 is also mirrored by transistor M8. Therefore, a total current I_BIAS flows through the two branches formed by transistors M3 and M4 (first branch) and by transistors M5 and M6 (second branch).

Meanwhile, the gate and drain of transistor M3 are shorted, and the gates of transistors M3 and M5 are connected to form another current mirror that provides a load for the differential pair formed by transistors M4 and M6. When the gate voltages provided to transistors M4 and M6 (i.e., the inputs to op-amp 240(A)) are the same, transistors M3 and M5 split the flow of current I_BIAS equally through transistors M4 and M6. However, when the gate voltages of transistors M4 and M6 are different, transistor M5 adjusts its drain voltage (i.e., the output of op-amp 240(A)) in response.

For example, if the voltage provided at the gate of transistor M4 (i.e., the voltage at the output of inverter 210(A)) is greater than the voltage provided at the gate of transistor M6 (i.e., reference voltage V_MID), then transistor M4 is turned on more strongly than transistor M6, and the current flow through transistor M4 increases. Since the total current flow through transistors M4 and M6 is fixed at current I_BIAS by transistor M8, this increase in current flow through transistor M4 means that the current flow through transistor M6 must decrease.

To provide this current reduction, the drain voltage of transistor M6 is increased. This has the effect of reducing the gate-drain voltage of transistor M6, which in turn reduces the current flow through transistor M6. Meanwhile, this increased drain voltage of transistor M6 is applied to the input of inverter 210(A) (via resistor R_IN(A)), thereby driving the voltage at the output of inverter 210(A) down towards reference voltage V_MID.

Similarly, if the voltage provided at the gate of transistor M4 is less than the voltage provided at the gate of transistor M6, then transistor M4 is turned on less strongly than transistor M6, and the current flow through transistor M4 decreases. Therefore, the current flow through transistor M6 must increase, and the drain voltage of transistor M6 is decreased to increase the gate-drain voltage of transistor M6. This decreased drain voltage of transistor M6 is applied to the input of inverter 210(A), thereby driving the voltage at the output of inverter 210(A) up towards reference voltage V_MID.

Of course, the circuitry shown for op-amp 240(A) in FIG. 3 is exemplary only. Alternatives may be found in the conventional art.

The various embodiments of the structures and methods of this invention that are described above are illustrative only of the principles of this invention and are not intended to limit the scope of the invention to the particular embodiments described. For example, capacitors C_IN(A) and C_IN(B) could be removed from differential amplifier 200 in FIG. 2A, thereby enabling amplification of DC input voltages at input terminals 201(A) and 201(B). Thus, the invention is limited only by the following claims and their equivalents.

What is claimed is:

1. An amplifier circuit comprising:
   a first input terminal;
   a second input terminal;
   a first output terminal;
   a second output terminal;
   a first complementary metal-oxide-semiconductor (CMOS) inverter coupled between the first input terminal and the first output terminal;
   a first bias circuit for applying linear biasing to the first CMOS inverter, the first bias circuit being coupled between an output of the first CMOS inverter and the input of the first CMOS inverter;
   a second CMOS inverter coupled between the second input terminal and the second output terminal; and
   a second bias circuit for applying linear biasing to the second CMOS inverter, the second bias circuit being coupled between an output of the second CMOS inverter and the input of the second CMOS inverter.

2. The amplifier circuit of claim 1, wherein the first input terminal is coupled to the input of the first CMOS inverter by a first capacitor, and
   wherein the second input terminal is coupled to the input of the second CMOS inverter by a second capacitor.

3. The amplifier circuit of claim 1, wherein the first CMOS inverter comprises a first p-type metal-oxide-semiconductor (PMOS) transistor and a first n-type metal-oxide-semiconductor (NMOS) transistor,
   wherein the second CMOS inverter comprises a second PMOS transistor and a second NMOS transistor,
   wherein the first PMOS transistor and the first NMOS transistor are serially connected between an upper supply voltage and a lower supply voltage,
   wherein the second PMOS transistor and the second NMOS transistor are serially connected between the upper supply voltage and the lower supply voltage,
   wherein a gate of the first PMOS transistor and a gate of the first NMOS transistor are connected to the input of the first CMOS inverter,
   wherein a gate of the second PMOS transistor and a gate of the second NMOS transistor are connected to the input of the second CMOS inverter,
   wherein a drain of the first PMOS transistor and a drain of the first NMOS transistor are connected to the output of the first CMOS inverter, and
   wherein a drain of the second PMOS transistor and a drain of the second NMOS transistor are connected to the output of the second CMOS inverter.

4. The amplifier circuit of claim 3, wherein the first bias circuit comprises a first operational amplifier (op-amp), a non-inverting input of the first op-amp being coupled to the output of the first CMOS inverter, an output of the first op-amp being coupled to the input of the first CMOS inverter, and an inverting input of the first op-amp being coupled to receive a reference voltage, the reference voltage being between the first supply voltage and the second supply voltage, and the first supply voltage being greater than the second supply voltage, and
   wherein the second bias circuit comprises a second op-amp, a non-inverting input of the second op-amp being coupled to the output of the second CMOS inverter, an output of the second op-amp being coupled to the input of the second CMOS inverter, and an inverting input of the second op-amp being coupled to receive the reference voltage.

5. The amplifier circuit of claim 4, wherein the reference voltage is halfway between the first supply voltage and the second supply voltage.

6. The amplifier circuit of claim 4, wherein the non-inverting input of the first op-amp is coupled to the output of the first CMOS inverter by a first resistor,
   wherein the output of the first op-amp is coupled to the input of the first CMOS inverter by a second resistor,
   wherein the non-inverting input of the second op-amp is coupled to the output of the second CMOS inverter by a third resistor, and
   wherein the output of the second op-amp is coupled to the input of the second CMOS inverter by a fourth resistor.

7. The amplifier circuit of claim 6, wherein the non-inverting input of the first op-amp is coupled to the second supply voltage by a first capacitor,
   wherein the output of the first op-amp is coupled to the second supply voltage by a second capacitor,
   wherein the non-inverting input of the second op-amp is coupled to the second supply voltage by a third capacitor, and
   wherein the output of the second op-amp is coupled to the second supply voltage by a fourth capacitor.

8. The amplifier circuit of claim 1, further comprising:
   a first amplifier stage coupled to the first output terminal; and
   a second amplifier stage coupled to the second output terminal.

9. The amplifier circuit of claim 8, wherein the first amplifier stage comprises a third input terminal coupled to the first output terminal, a third output terminal, a third CMOS inverter coupled between the third input terminal and the third output terminal, and a third bias circuit for applying linear biasing to the third CMOS inverter, the third bias circuit being coupled between an output of the third CMOS inverter and the input of the third CMOS inverter, and
   wherein the second amplifier stage comprises a fourth input terminal coupled to the second output terminal, a fourth output terminal, a fourth CMOS inverter coupled between the fourth input terminal and the fourth output terminal, and a fourth bias circuit for applying linear biasing to the fourth CMOS inverter, the fourth bias circuit being coupled between an output of the fourth CMOS inverter and the input of the fourth CMOS inverter.

10. A method for operating a high frequency amplifier, the method comprising:
    providing a first complementary metal-oxide-semiconductor (CMOS) inverter and a second CMOS inverter;
    applying linear biasing to the first CMOS inverter and the second CMOS inverter;
    supplying a first alternating current (AC) signal to the input of the first CMOS inverter and a second AC signal to the input of the second CMOS inverter to generate an amplified differential signal.

11. The method of claim 10, wherein applying linear biasing to the first CMOS inverter comprises supplying a DC bias voltage to the input of the first CMOS inverter to drive a first DC offset voltage at an output of the first CMOS inverter to a reference voltage, and
    wherein applying linear biasing to the second CMOS inverter comprises supplying the DC bias voltage to the input of the second CMOS inverter to drive a second DC offset voltage at an output of the second CMOS inverter to the reference voltage.

12. The method of claim 11, wherein supplying the DC offset voltage to the input of the first CMOS inverter comprises providing the DC offset voltage to a non-inverting input of a first operational amplifier (op-amp), providing the reference voltage to an inverting input of the first op-amp, and providing an output voltage of the first op-amp to the input of the first CMOS inverter, and wherein supplying the DC offset voltage to the input of the second CMOS inverter comprises providing the DC offset voltage to a non-inverting input of a second op-amp, providing the reference voltage to an inverting input of the second op-amp, and providing an output voltage of the second op-amp to the input of the second CMOS inverter.

13. The method of claim 12, wherein providing the DC offset voltage to the non-inverting input of the first op-amp comprises coupling the output of the first CMOS inverter to the non-inverting input of the first op-amp via a first resistor, wherein providing the output voltage of the first op-amp to the input of the first CMOS inverter comprises coupling an output of the first op-amp to the input of the first CMOS inverter via a second resistor, wherein providing the DC offset voltage to the non-inverting input of the second op-amp comprises coupling the output of the second CMOS inverter to the non-inverting input of the second op-amp via a third resistor, and wherein providing the output voltage of the second op-amp to the input of the second CMOS inverter comprises coupling an output of the second op-amp to the input of the second CMOS inverter via a fourth resistor.

14. The method of claim 13, wherein the first CMOS inverter comprises a first PMOS transistor and a first NMOS transistor serially connected between an upper supply voltage and a lower supply voltage, wherein the second CMOS inverter comprises a second PMOS transistor and a second NMOS transistor serially connected between the upper supply voltage and the lower supply voltage, and wherein the reference voltage is halfway between the upper supply voltage and the lower supply voltage.

15. The method of claim 14, wherein providing the output voltage of the first op-amp to the input of the first CMOS inverter further comprises coupling the output of the first op-amp to the lower supply voltage via a first capacitor, wherein providing the DC offset voltage to the non-inverting input of the first op-amp further comprises coupling the non-inverting input of the first op-amp to the lower supply voltage via a second capacitor, wherein providing the output voltage of the second op-amp to the input of the second CMOS inverter further comprises coupling the output of the second op-amp to the lower supply voltage via a third capacitor, and wherein providing the DC offset voltage to the non-inverting input of the second op-amp further comprises coupling the non-inverting input of the second op-amp to the lower supply voltage via a fourth capacitor.

16. The method of claim 14, wherein supplying a first alternating current (AC) signal to the input of the first CMOS inverter and a second AC signal to the input of the second CMOS inverter comprises:

receiving a first high frequency input signal;
filtering out DC components from the first high frequency input signal to generate the first AC signal;
receiving a second high frequency input signal; and
filtering out DC components from the second high frequency input signal to generate the second AC signal.

17. A high frequency amplifier comprising:
a first complementary metal-oxide-semiconductor (CMOS) inverter;
a second CMOS inverter;
means for regulating a first DC bias voltage at an input of the first CMOS inverter to force a DC offset voltage at an output of the first CMOS inverter to a reference voltage between an upper supply voltage and a lower supply voltage; and
means for regulating a second DC bias voltage at an input of the second CMOS inverter to force a DC offset voltage at an output of the second CMOS inverter to the reference voltage.

18. The high frequency amplifier of claim 17, wherein the first CMOS inverter comprises a first p-type metal-oxide-semiconductor (PMOS) transistor and a first n-type metal-oxide-semiconductor (NMOS) transistor serially connected between an upper supply voltage and a lower supply voltage, wherein the second CMOS inverter comprises a second PMOS transistor and a second NMOS transistor serially connected between the upper supply voltage and the lower supply voltage, the reference voltage being between the upper supply voltage and the lower supply voltage.

19. The high frequency amplifier of claim 18, wherein the reference voltage is halfway between the upper supply voltage and the lower supply voltage.

20. The high frequency amplifier of claim 18, wherein the means for regulating the first DC bias voltage comprises a first operational amplifier (op-amp), a non-inverting input of the first op-amp being coupled to the output of the CMOS inverter via a first resistor, an inverting input of the first op-amp being coupled to receive the reference voltage, and an output of the first op-amp being coupled to the input of the first CMOS inverter via a second resistor, and wherein the means for regulating the second DC bias voltage comprises a second op-amp, a non-inverting input of the second op-amp being coupled to the output of the CMOS inverter via a third resistor, an inverting input of the second op-amp being coupled to receive the reference voltage, and an output of the second op-amp being coupled to the input of the second CMOS inverter via a fourth resistor.

21. The high frequency amplifier of claim 20, wherein the means for regulating the first DC bias voltage further comprises a first capacitor coupled between the non-inverting input of the first op-amp and the lower supply voltage, and a second capacitor coupled between the output of the first op-amp and the lower supply voltage, and wherein the means for regulating the second DC bias voltage further comprises a third capacitor coupled between the non-inverting input of the second op-amp and the lower supply voltage, and a fourth capacitor coupled between the output of the second op-amp and the lower supply voltage.

22. An amplification circuit comprising:
a first complementary metal-oxide-semiconductor (CMOS) inverter coupled between an upper supply voltage and a lower supply voltage;
a second CMOS inverter coupled between the upper supply voltage and the lower supply voltage;
a first operational amplifier (op-amp), a non-inverting input of the first op-amp being coupled to an output of the first CMOS inverter, an inverting input of the first op-amp being coupled to receive a reference voltage, the reference voltage being between the upper supply voltage and the lower supply voltage, and an output of the first op-amp being coupled to an input of the first CMOS inverter; and a second op-amp, a non-inverting input of the second op-amp being coupled to an output of the second CMOS inverter, an inverting input of the second op-amp being coupled to receive the reference voltage, and an output of the second op-amp being coupled to an input of the second CMOS inverter.

23. The amplification circuit of claim 22, wherein the non-inverting input of the first op-amp is coupled to the output of the first CMOS inverter by a first resistor,
wherein the output of the first op-amp is coupled to the input of the first CMOS inverter by a second resistor,
wherein the non-inverting input of the second op-amp is coupled to the output of the second CMOS inverter by a third resistor, and
wherein the output of the second op-amp is coupled to the input of the second CMOS inverter by a fourth resistor.

24. The amplification circuit of claim 23, wherein the non-inverting input of the first op-amp is coupled to the lower supply voltage by a first capacitor,
wherein the output of the first op-amp is coupled to the lower supply voltage by a second capacitor,
wherein the non-inverting input of the second op-amp is coupled to the lower supply voltage by a third capacitor, and
wherein the output of the second op-amp is coupled to the lower supply voltage by a fourth capacitor.

25. The amplification circuit of claim 24, further comprising:
a first input terminal coupled to the input of the first CMOS inverter by a fifth capacitor; and
a second input terminal coupled to the input of the second CMOS inverter by a sixth capacitor.

* * * * *